United States Patent
Suzuki et al.

(10) Patent No.: US 7,642,542 B2
(45) Date of Patent: Jan. 5, 2010

(54) SEMICONDUCTOR LIGHT-EMITTING DEVICE AND PRODUCING METHOD FOR THE SAME

(75) Inventors: Mariko Suzuki, Yokohama (JP); Tomio Ono, Yokohama (JP); Tadashi Sakai, Yokohama (JP); Naoshi Sakuma, Yokohama (JP); Hiroaki Yoshida, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 124 days.

(21) Appl. No.: 11/531,577

(22) Filed: Sep. 13, 2006

(65) Prior Publication Data
US 2007/0114539 A1    May 24, 2007

(30) Foreign Application Priority Data
Sep. 29, 2005 (JP) .............................. 2005-285592

(51) Int. Cl.
*H01L 29/06* (2006.01)
*H01L 31/0328* (2006.01)
*H01L 31/0336* (2006.01)
*H01L 31/072* (2006.01)
*H01L 31/109* (2006.01)
*H01L 27/15* (2006.01)
*H01L 29/26* (2006.01)
*H01L 31/12* (2006.01)
*H01L 33/00* (2006.01)
*H01L 29/24* (2006.01)

(52) U.S. Cl. ........................... 257/13; 257/79; 257/101; 257/102; 257/103; 257/E33.025; 257/E33.028; 257/E33.03; 257/E33.033; 257/E33.034; 257/E33.067

(58) Field of Classification Search ................... 257/13, 257/79, 101–103, E33.025, E33.028, E33.03, 257/E33.033, E33.034, E33.067
See application file for complete search history.

(56) References Cited

U.S. PATENT DOCUMENTS

| 4,999,315 A | * | 3/1991 | Johnston et al. ............. 117/102 |
| 5,610,412 A | * | 3/1997 | Awano et al. .................. 257/85 |
| 5,696,389 A | * | 12/1997 | Ishikawa et al. ............... 257/99 |
| 5,959,070 A | * | 9/1999 | Jenekhe et al. .............. 528/337 |
| 6,017,774 A | * | 1/2000 | Yuasa et al. .................... 438/46 |

(Continued)

FOREIGN PATENT DOCUMENTS

WO    WO 2004/032248 A2    4/2004

OTHER PUBLICATIONS

Satoshi Koizumi, et al., "Ultraviolet Emission from a Diamond pn Junction", Science vol. 292 (2001), Jun. 8, 2001, pp. 1899-1901.

(Continued)

*Primary Examiner*—Ida M Soward
(74) *Attorney, Agent, or Firm*—Oblon, Spivak, McClelland, Maier & Neustadt, L.L.P.

(57) ABSTRACT

A semiconductor light-emitting device includes: a first semiconductor layer; a light-emitting layer being disposed on the first semiconductor layer; a second semiconductor layer being disposed on the light-emitting layer, and metal electrodes connected to the first semiconductor layer and the second semiconductor layer. The light-emitting layer is lower in refractive index than the first semiconductor layer. The second semiconductor layer is lower in refractive index than the light-emitting layer. The metal electrodes supply a current to the light-emitting layer.

16 Claims, 11 Drawing Sheets

U.S. PATENT DOCUMENTS

| | | | |
|---|---|---|---|
| 6,738,402 B1 * | 5/2004 | Hosoda et al. | 372/43.01 |
| 6,956,241 B2 * | 10/2005 | Sugawara et al. | 257/79 |
| 7,285,800 B2 * | 10/2007 | Lai et al. | 257/81 |
| 7,288,797 B2 * | 10/2007 | Deguchi et al. | 257/99 |
| 7,352,006 B2 * | 4/2008 | Beeson et al. | 257/79 |
| 7,361,938 B2 * | 4/2008 | Mueller et al. | 257/94 |
| 2002/0014622 A1 * | 2/2002 | Shimoyama et al. | 257/14 |
| 2003/0015715 A1 | 1/2003 | Sakai | 257/79 |
| 2003/0169981 A1 * | 9/2003 | Nakanishi et al. | 385/92 |
| 2003/0178702 A1 | 9/2003 | Sawaki et al. | 257/622 |
| 2004/0211969 A1 * | 10/2004 | Ishizaki | 257/94 |
| 2005/0001225 A1 * | 1/2005 | Yoshimura et al. | 257/98 |
| 2005/0087758 A1 * | 4/2005 | Kwak et al. | 257/99 |
| 2005/0093008 A1 | 5/2005 | Suehiro et al. | 257/98 |
| 2005/0173714 A1 * | 8/2005 | Lee et al. | 257/84 |
| 2007/0018182 A1 * | 1/2007 | Beeson et al. | 257/98 |
| 2009/0052491 A1 * | 2/2009 | Nomura et al. | 372/50.11 |

OTHER PUBLICATIONS

C. R. Miskys, et al., "AlN/diamond heterojunction diodes", Applied physics letters. vol. 82, No. 2, Jan. 13, 2003, pp. 290-292.

* cited by examiner

LIGHT EXTRACTION DIRECTION

SEMICONDUCTOR LIGHT-EMITTING DEVICE AND PRODUCING METHOD FOR THE SAME

CROSS-REFERENCE TO RELATED APPLICATION

This application is based on and claims the benefit of priority from the prior Japanese Patent Application No. 2005-285592, filed on Sep. 29, 2005; the entire contents of which are incorporated herein by reference.

TECHNICAL FIELD

The present invention relates to a semiconductor light-emitting device and a producing method for the same.

BACKGROUND

Description of Related Art

Diamond has been widely noticed as a semiconductor light-emitting material because of its excellent potential semiconductor and optical characteristics as well as its mechanical, chemical and thermal characteristics. Particularly, because diamond has a band gap of about 5.5 eV at room temperature, diamond has potential ability to serve as a light-emitting device capable of emitting light in an ultraviolet region. As examples of diamond used as a light-emitting device, there are known an LED using a pn junction of diamond (see S. Koizumi, et al., Science 292, 1899 (2001)), an LED using a pn junction of n-type diamond and p-type AlN formed on the n-type diamond (see C. R. Miskys, et al., APL 82, 290 (2003)), etc.

SUMMARY

Diamond is an indirect semiconductor. For this reason, it is known that in use of a light-emitting device using diamond, the possibility of change into a light-emitting process (hereinafter referred to as luminous efficiency) in an excited state due to injection of electric charge is lower than luminous efficiency in use of a light-emitting device using a direct band-gap semiconductor such as GaAs. This is for the following reason. In the light-emitting device using a pn junction of diamond as described in Non-Patent Document 1 or 2, real electric resistance of diamond is high. For this reason, a highly excited state is required, that is, a current as high as possible needs to be supplied to a narrow region in order to obtain higher luminous efficiency. As a result, the size of the light-emitting device is increased. Moreover, because a current as high as possible needs to be supplied, the light-emitting device per se generates heat. As a result, the life of the light-emitting device is shortened.

The present invention has been made in view of the above circumstances and provides a semiconductor light-emitting device and a producing method for the same. According to an aspect of the present invention, there is provided a semiconductor light-emitting device with high luminous efficiency, low heat generation and long life and a method for producing the semiconductor light-emitting device.

According to another aspect of the invention, a semiconductor light-emitting device includes: a first semiconductor layer; a light-emitting layer being disposed on the first semiconductor layer; a second semiconductor layer being disposed on the light-emitting layer, and metal electrodes connected to the first semiconductor layer and the second semiconductor layer. The light-emitting layer is lower in refractive index than the first semiconductor layer. The second semiconductor layer is lower in refractive index than the light-emitting layer. The metal electrodes supply a current to the light-emitting layer.

According to another aspect of the invention, there is provided a producing method of a semiconductor light-emitting device including: forming a first semiconductor layer on a substrate; forming a light-emitting layer lower in refractive index than the first semiconductor layer, on the first semiconductor layer; forming a second semiconductor layer lower in refractive index than the light-emitting layer, on the light-emitting layer; and forming metal electrodes to be connected to the first semiconductor layer and the second semiconductor layer. The metal electrodes supply a current to the light-emitting layer.

BRIEF DESCRIPTION OF THE DRAWINGS

These and other objects and advantages of this invention will become more fully apparent from the following detailed description taken with the accompanying drawings in which.

DESCRIPTION OF THE EMBODIMENTS

Figure 1:
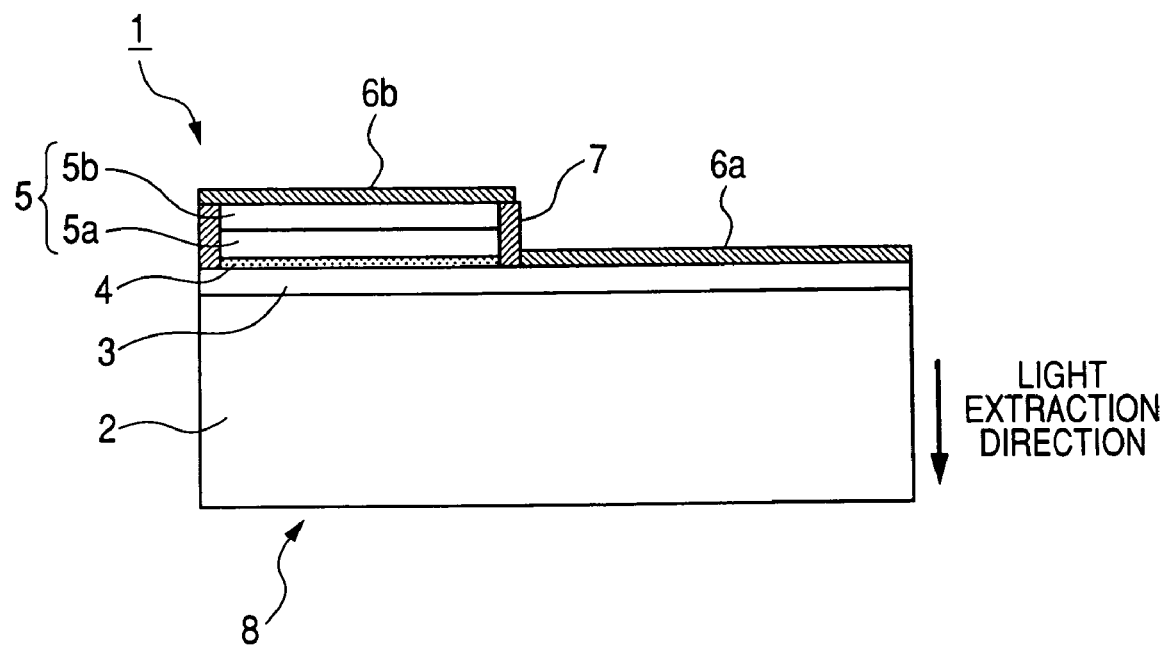
FIG. 1 is an exemplary sectional view showing the schematic configuration of a semiconductor light-emitting device according to a first embodiment.

Inventors of the present invention finds that luminous efficiency of a semiconductor light-emitting device can be improved when a semiconductor layer transparent to the wavelength of emitted light and high in refractive index and having the property of allowing carrier confinement is used on a side of extraction of light from a light-emitting layer while a semiconductor layer low in refractive index to the wavelength of emitted light and having the property of performing carrier confinement is used on a side opposite to the side of extraction of light from the light-emitting layer in order to increase the luminous efficiency of the semiconductor light-emitting device.

If a low refractive index layer is provided so as to be adjacent to the light-emitting layer in the semiconductor light-emitting device, light reflection is apt to occur in an interface between the low refractive index layer and the light-emitting layer. This causes lowering of luminous efficiency in emission of light from the light-emitting layer to the lower refractive index layer. If a high current is supplied in order to increase luminous efficiency, light is concentrated on the light-emitting layer to thereby generate heat in the light-emitting layer. This causes deterioration of the light-emitting layer.

Therefore, when a layer higher in refractive index than the light-emitting layer is disposed on a side of extraction of light emitted from the light-emitting layer, confinement of light in the light-emitting layer can be reduced. On the other hand, when a layer lower in refractive index than the light-emitting layer is disposed on a side opposite to the side of extraction of light emitted from the light-emitting layer, reflection of light in an interface between the light-emitting layer and the lower refractive index layer can be used. Thus, a semiconductor light-emitting device with such high luminous efficiency that has not been achieved can be obtained by the synergic effect of the two layers. Moreover, confinement of light can be avoided. Accordingly, it is possible to obtain a semiconductor light-emitting device with long life and low heat generation in a light-emitting layer.

Embodiments will be described below with reference to the drawings. In description of the following drawings, identical or similar parts are referred to by identical or similar numerals. Incidentally, because the drawings are only typical, attention should be paid to the fact that the relation between thickness and planar size, thickness ratios of respective layers, etc. may be different from those in a real product. Accordingly, specific thicknesses and sizes should be judged in consideration of the following description. It is also a matter of course that portions different in relation between sizes and size ratio may be contained in the drawings.

First Embodiment

A semiconductor light-emitting device 1 according to a first embodiment of the invention will be described with reference to FIG. 1. FIG. 1 is a sectional view showing the schematic configuration of the semiconductor light-emitting device 1 according to the first embodiment.

As shown in FIG. 1, in the semiconductor light-emitting device 1 according to the first embodiment, a first semiconductor layer 3 is disposed on a substrate 2. A light-emitting layer 4 lower in refractive index than the first semiconductor layer 3 is disposed on the first semiconductor layer 3. A second semiconductor layer 5 lower in refractive index than the light-emitting layer 4 is disposed on the light-emitting layer 4. The other surface of the substrate 2 opposite to the surface on which the first semiconductor layer 3, the light-emitting layer 4 and the second semiconductor layer 5 are disposed serves as a light extraction portion 8 through which light emitted from the light-emitting layer 4 is extracted from the semiconductor light-emitting device 1.

Metal electrodes 6a and 6b are connected electrically to the first semiconductor layer 3 and the second semiconductor layer 5, respectively. An electrically insulating layer 7 is formed so that the metal electrodes 6a and 6b are electrically insulated from each other by the electrically insulating layer 7.

The substrate 2 is made of a material having a refractive index substantially equal to or higher than that of a material used for the first semiconductor layer 3. For example, a diamond substrate may be formed as the substrate 2.

The first semiconductor layer 3 is made of a material which is high in refractive index and which allows confinement of light. For example, the first semiconductor layer 3 may be made of a p-type or n-type conductive diamond thin film. Incidentally, the material used for the first semiconductor layer 3 is not limited to diamond. Any material may be used as the material of the first semiconductor layer 3 as long as the material is higher in refractive index than the light-emitting layer 4 which will be described later.

The light-emitting layer 4 is made of a material lower in refractive index than the first semiconductor layer 3. For example, the light-emitting layer 4 may be made of an undoped nitride semiconductor. Incidentally, the material used for the light-emitting layer 4 is not limited to the nitride semiconductor. Any material may be used as the material of the light-emitting layer 4 as long as the material is lower in refractive index than the first semiconductor layer 3 and higher in refractive index than the second semiconductor layer 5 which will be described later.

The second semiconductor layer 5 is made of a material lower in refractive index than the light-emitting layer 4. For example, the second semiconductor layer 5 may be made of a nitride semiconductor with p-type or n-type electric characteristic. Incidentally, the material used for the second semiconductor layer 5 is not limited to the nitride semiconductor. Any material may be used as the material of the second semiconductor layer 5 as long as the material is lower in refractive index than the light-emitting layer 4. Incidentally, the second semiconductor layer 5 may be formed as a laminate of two or more semiconductor layers made of different materials. For example, as shown in FIG. 1, the second semiconductor layer 5 may be formed as a two-layer structure with a clad layer 5a and a contact layer 5b. The clad layer 5a, which is a layer lower in refractive index than the light-emitting layer 4, is disposed on the light-emitting layer 4. The contact layer 5b is provided on the clad layer 5a so that the contact layer 5b is brought into contact with one of the metal electrodes.

Any metal may be used as the material of each of the metal electrodes 6a and 6b as long as the metal is electrically conductive. For example, each of the metal electrodes 6a and 6b can be made of a high-melting metal material having a melting point higher than 1000° C.

Any material may be used as the material of the electrically insulating film 7 as long as the material has such electrically insulating characteristic that the metal electrodes 6a and 6b can be electrically insulated from each other by the material. For example, a silicon oxide film can be formed as the electrically insulating layer 7.

Next, a method for producing the semiconductor light-emitting device according to the first embodiment will be described with reference to FIGS. 2A to 2D.

FIGS. 2A to 2D are sectional views schematically showing the method for producing the semiconductor light-emitting device 1 according to the first embodiment.

Figure 2A:
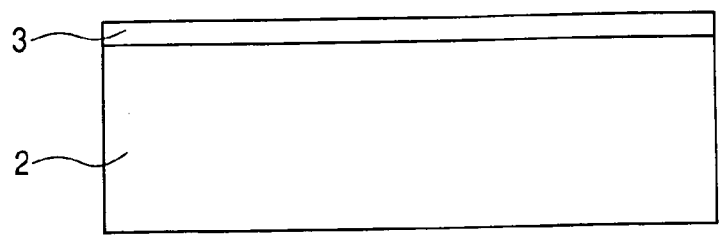
FIGS. 2A to 2D are exemplary sectional views schematically showing a method for producing the semiconductor light-emitting device according to the first embodiment.

First, a 1000 nm-thick p-type diamond layer doped with about $1\times10^{19}$ cm$^{-3}$ of boron is formed as the first semiconductor layer 3 on the diamond substrate 2 by a CVD method (FIG. 2A).

Figure 2B:
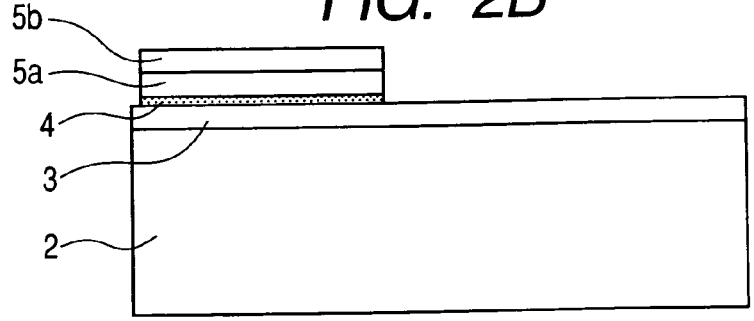

Then, a 100 nm-thick undoped In$_{0.02}$Al$_{0.44}$Ga$_{0.54}$N layer, a 1000 nm-thick n-type Al$_{0.73}$Ga$_{0.27}$N layer (Si-doped) and a 1000 nm-thick n-type GaN layer (Si-doped) are laminated continuously as the light-emitting layer 4, the clad layer 5a of the second semiconductor layer 5 and the contact layer 5b of the second semiconductor layer 5, respectively, on the p-type diamond layer. Then, part of these layers are removed by etching and patterned so that part of the surface of the p-type diamond layer is exposed (FIG. 2B).

Figure 2C:
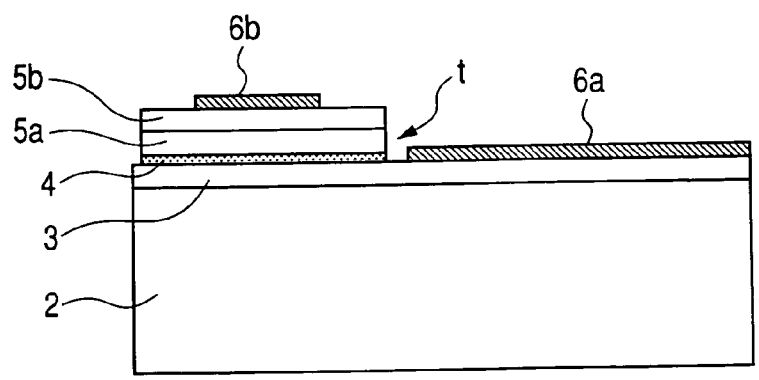

Then, a metal thin film of Ti(50 nm)-Pt(50 nm)-Au(200 nm) is formed on the p-type diamond layer by electronic beam evaporation and annealed in Ar at 650° C. for ten minutes. Then, a portion of the formed metal thin film corresponding to an end portion t of the light-emitting layer 4 and the second semiconductor layer 5 is etched in an RIE manner so that metal thin films which serve as the metal electrodes 6a and 6b are formed separately on the p-type diamond layer and the n-type GaN layer (Si-doped) respectively (FIG. 2C).

Figure 2D:
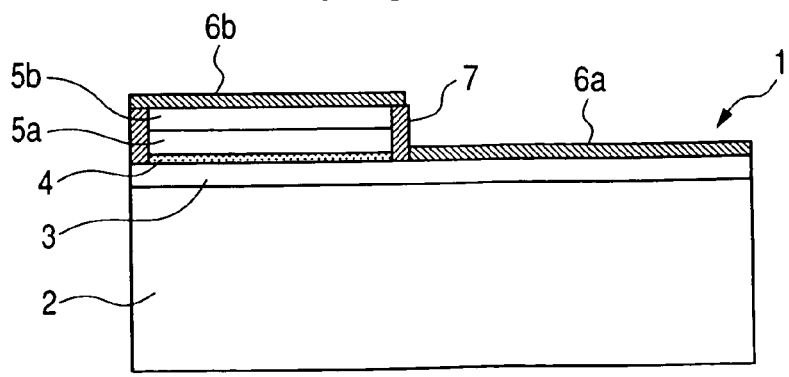

Then, an SiO$_2$ layer which serves as the electrically insulating layer 7 is formed by a CVD method so that the formed metal thin films are electrically insulated from each other by the electrically insulating layer 7 (FIG. 2D).

Finally, the diamond substrate 2 is cut and packaged to thereby produce the semiconductor light-emitting device 1 according to the first embodiment.

Although description has been made upon the case where an undoped In$_{0.02}$Al$_{0.44}$Ga$_{0.54}$N layer and an n-type Al$_{0.73}$Ga$_{0.27}$N layer (Si-doped) are used as the light-emitting layer 4 and the clad layer 5a of the second semiconductor layer 5 brought into contact with the light-emitting layer 4, respectively, the refractive index of the GaN nitride semiconductor can be changed when the mixture ratio of Al in the GaN nitride semiconductor is changed. That is, the refractive index of the nitride semiconductor increases as the mixture ratio of Al decreases. The refractive index of the nitride semiconductor decreases as the mixture ratio of Al increases. As described above, the light-emitting layer 4 and the second semiconductor layer 5 can be formed easily by a simple operation of changing the mixture ratio of Al when the nitride semiconductor is used for forming the light-emitting layer 4 and the second semiconductor layer 5.

Then, a voltage is applied between the metal electrodes 6a and 6b of the produced semiconductor light-emitting device 1 to supply a current to the light-emitting layer 4. As a result, emission of ultraviolet light with an emission wavelength of 320 nm becomes intensive in the condition of a light output of 10 mW at 300 mA.

Second Embodiment

Figure 3:
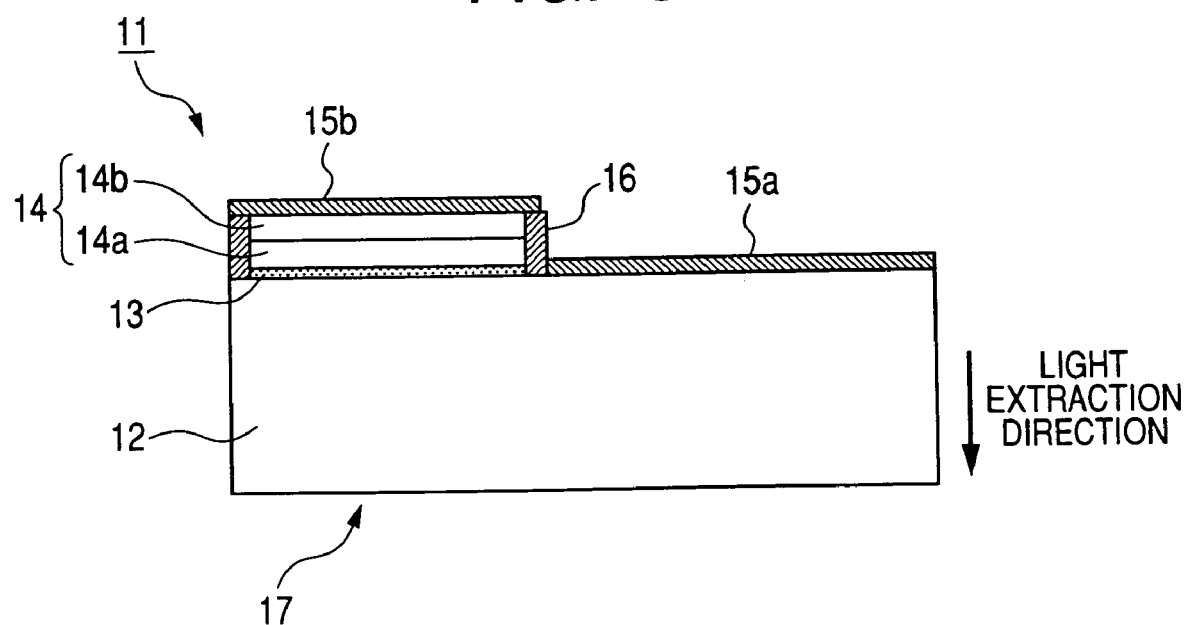
FIG. 3 is an exemplary sectional view showing the schematic configuration of a semiconductor light-emitting device according to a second embodiment.

A semiconductor light-emitting device 11 according to a second embodiment of the invention will be described with reference to FIG. 3. FIG. 3 is a sectional view showing the schematic configuration of the semiconductor light-emitting device 11 according to the second embodiment.

As shown in FIG. 3, in the semiconductor light-emitting device 11 according to the second embodiment, a light-emitting layer 13 lower in refractive index than a p-type or n-type conductive substrate 12 is disposed on the substrate 12. A second semiconductor layer 14 lower in refractive index than the light-emitting layer 13 is disposed on the light-emitting layer 13. The other surface of the substrate 12 opposite to the surface on which the light-emitting layer 13 and the second semiconductor layer 14 are disposed serves as a light extraction portion 17 through which light emitted from the light-emitting layer 13 is extracted from the semiconductor light-emitting device 11.

Metal electrodes 15a and 15b are electrically connected to the substrate 12 and the second semiconductor layer 14, respectively. An electrically insulating layer 16 is formed so that the metal electrodes 15a and 15b are electrically insulated from each other by the electrically insulating layer 16.

That is, the semiconductor light-emitting device 11 according to this embodiment is characterized in that the first semiconductor layer 3 described in the first embodiment is replaced with the p-type or n-type conductive substrate 12. The other configuration is the same as that in the first embodiment so that description thereof will be omitted.

The substrate 12 is made of a material higher in refractive index than the light-emitting layer 13. For example, the substrate 12 may be made of a p-type or n-type conductive diamond substrate. Incidentally, the substrate 12 used here may be p-type or n-type conductive as a whole or an impurity-diffused layer which has p-type or n-type electric characteristic and which is high in refractive index may be formed as a first semiconductor layer on the surface of the substrate 12.

Next, a method for producing the semiconductor light-emitting device 11 according to the second embodiment will be described with reference to FIGS. 4A to 4D.

FIGS. 4A to 4D are sectional views schematically showing the method for producing the semiconductor light-emitting device 11 according to the second embodiment.

Figure 4A:
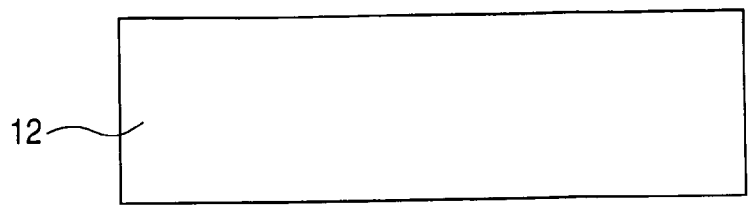
FIGS. 4A to 4D are exemplary sectional views schematically showing a method for producing the semiconductor light-emitting device according to the second embodiment.
Figure 4B:
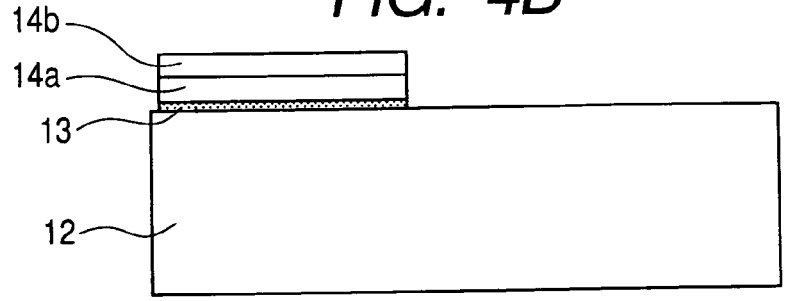

First, a p-type diamond substrate 12 doped with about $1\times10^{19}$ cm$^{-3}$ of boron is prepared (FIG. 4A). Then, a 100 nm-thick undoped In$_{0.02}$Al$_{0.44}$Ga$_{0.54}$N layer, a 1000 nm-thick n-type Al$_{0.73}$Ga$_{0.27}$N layer (Si-doped) and a 1000 nm-thick n-type GaN layer (Si-doped) are laminated continuously as the light-emitting layer 13, the clad layer 14a of the second semiconductor layer 14 and the contact layer 14b of the second semiconductor layer 14, respectively, on the diamond substrate 12 by an MBE method. Then, part of these layers are removed by etching and patterned so that part of the surface of the p-type diamond substrate 12 is exposed (FIG. 4B).

Figure 4C:
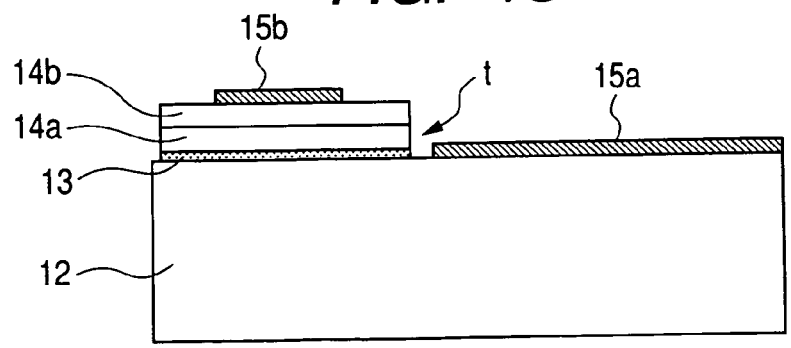

Then, a metal thin film of Ti(50 nm)-Pt(50 nm)-Au(200 nm) is formed on the surface of the p-type diamond substrate 12 by electronic beam evaporation and annealed in Ar at 650° C. for ten minutes. Then, a portion of the formed metal thin film corresponding to an end portion t of the light-emitting layer 13 and the second semiconductor layer 14 is etched in an RIE manner so that metal thin films which serve as the metal electrodes 15a and 15b are formed separately on the p-type diamond substrate 12 and the n-type GaN layer (Si-doped), respectively (FIG. 4C).

Figure 4D:
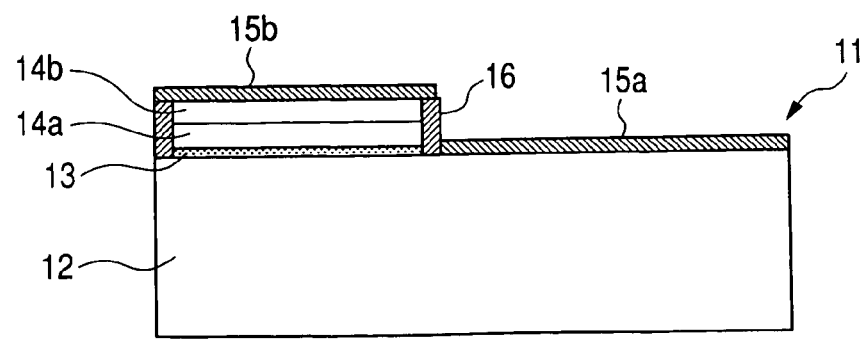

Then, an SiO$_2$ layer which serves as the electrically insulating layer 16 is formed by a CVD method so that the formed metal thin films are electrically insulated from each other by the electrically insulating layer 16 (FIG. 4D).

Finally, the diamond substrate 12 is cut and packaged to thereby produce the semiconductor light-emitting device 11 according to the second embodiment.

Then, a voltage is applied between the metal electrodes 15a and 15b of the produced semiconductor light-emitting device 11 to supply a current to the light-emitting layer 13. As a result, emission of ultraviolet light with an emission wavelength of 320 nm becomes intensive in the condition of a light output of 10 mW at 300 mA.

Third Embodiment

Figure 5:
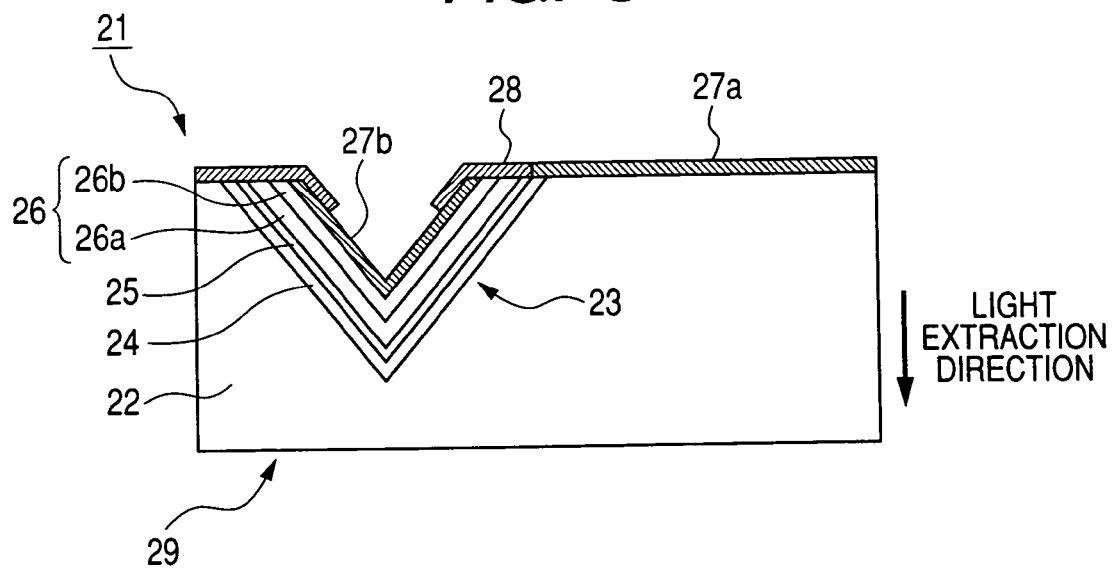
FIG. 5 is an exemplary sectional view showing the schematic configuration of a semiconductor light-emitting device according to a third embodiment.
Figure 6:
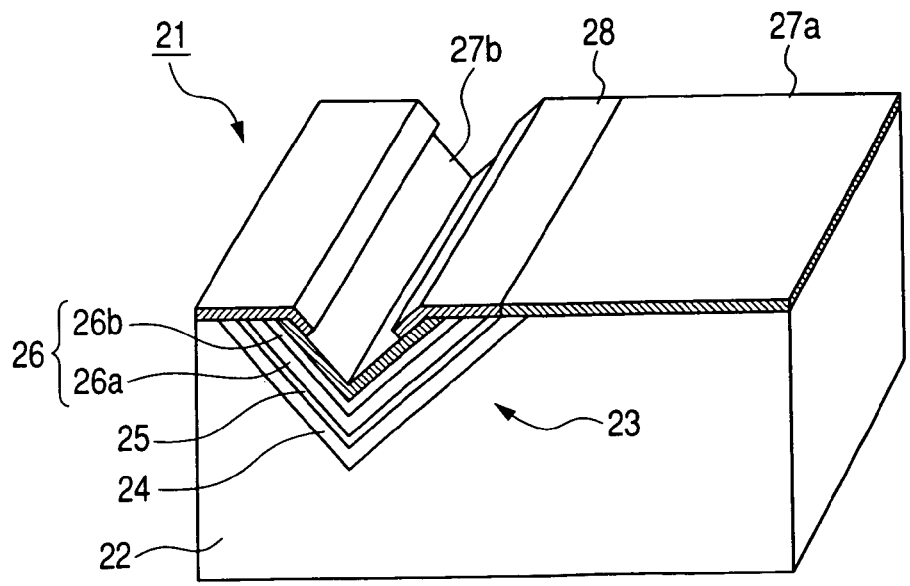
FIG. 6 is an exemplary taper sectional view of the semiconductor light-emitting device according to the third embodiment when seen obliquely.

A semiconductor light-emitting device 21 according to a third embodiment of the invention will be described with reference to FIGS. 5 and 6. FIG. 5 is a sectional view showing the schematic configuration of the semiconductor light-emitting device 21 according to the third embodiment. FIG. 6 is a taper sectional view of the semiconductor light-emitting device 21 according to the third embodiment when seen obliquely.

As shown in FIGS. 5 and 6, in the semiconductor light-emitting device 21 according to the third embodiment, a V-groove 23 is formed on a substrate 22. A first semiconductor layer 24 is disposed in the V-groove 23. A light-emitting layer 25 lower in refractive index than the first semiconductor layer 24 is disposed on the first semiconductor layer 24. A second semiconductor layer 26 lower in refractive index than the light-emitting layer 25 is disposed on the light-emitting layer 25. The other surface of the substrate 22 opposite to the surface on which the V-groove 23 is formed serves as a light extraction portion 29 through which light emitted from the light-emitting layer 25 is extracted from the semiconductor light-emitting device 21.

Metal electrodes 27a and 27b are electrically connected to the first semiconductor layer 24 and the second semiconductor layer 26, respectively. An electrically insulating layer 28 is formed so that the metal electrodes 27a and 27b are electrically insulated from each other by the electrically insulating layer 28.

That is, the semiconductor light-emitting device 21 according to the embodiment is characterized in that the lamination structure of the first semiconductor layer, the light emitting layer and the second semiconductor layer as described in the first embodiment is disposed in the V-groove 23 formed on the substrate 22. The remaining configuration is the same as that in the first embodiment so that description thereof will be omitted.

As described above, because the V-shaped light-emitting layer is disposed in the V-groove 23 formed on the substrate 22, it is possible to extract light with high luminous efficiency in a wider area. Moreover, even in the case where brighter light needs to be emitted, a high current can be supplied to thereby emit brighter light with high luminous efficiency in a wide area. Moreover, confinement of light can be avoided. Accordingly, it is possible to provide a semiconductor light-emitting device with long life and low heat generation in a light-emitting layer.

Next, a method for producing the semiconductor light-emitting device 21 according to the third embodiment will be described with reference to FIGS. 7A to 7D.

FIGS. 7A to 7D are sectional views schematically showing the method for producing the semiconductor light-emitting device 21 according to the third embodiment.

Figure 7A:
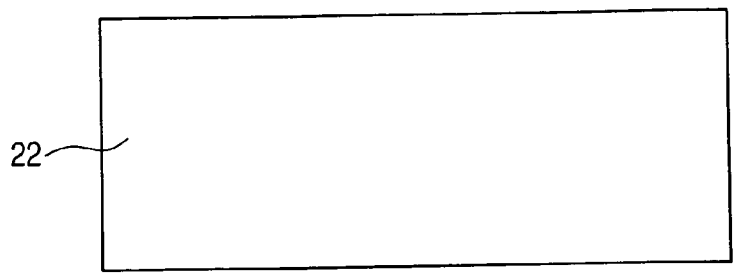
FIGS. 7A to 7D are exemplary sectional views schematically showing a method for producing the semiconductor light-emitting device according to the third embodiment.
Figure 7B:
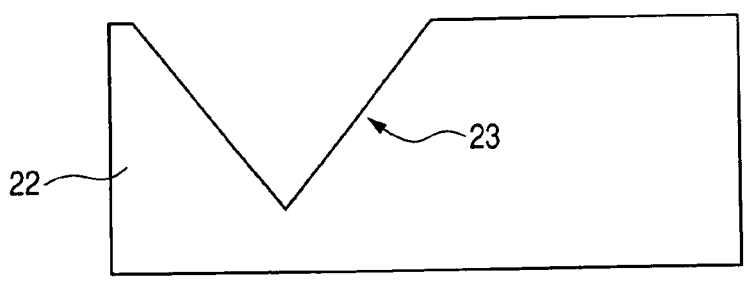

First, a diamond substrate 22 having plane directions of {100} faces is prepared (FIG. 7A). Then, a V-groove 23 made from plane directions of {111} faces is formed in the surface of the diamond substrate 22 by laser beam machining or the like (FIG. 7B).

Figure 7C:
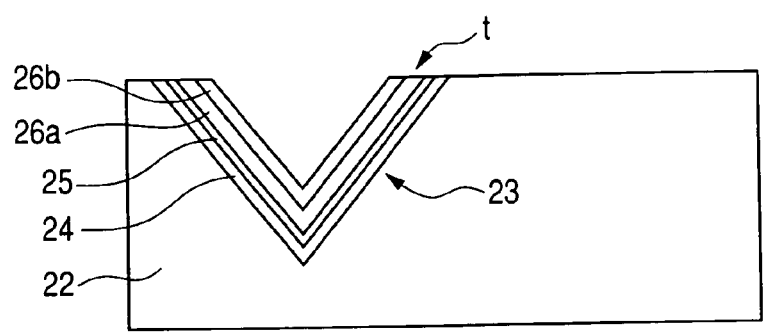

Then, a 1000 nm-thick p-type diamond layer doped with about $1 \times 10^{19}$ cm$^{-3}$ of boron, a 100 nm-thick undoped In$_{0.02}$Al$_{0.44}$Ga$_{0.54}$N layer, a 1000 nm-thick n-type Al$_{0.73}$Ga$_{0.27}$N layer (Si-doped) and a 1000 nm-thick n-type GaN layer (Si-doped) are laminated continuously as the first semiconductor layer 24, the light-emitting layer 25, the clad layer 26a of the second semiconductor layer 26 and the contact layer 26b of the second semiconductor layer 26, respectively, in the V-groove 23 by a CVD method. Then, part of these layers are removed by etching and patterned so that part of the surface of the diamond substrate 22 is exposed. Thus, the first semiconductor layer 24, the light-emitting layer 25 and the second semiconductor layer 26 are laminated in the V-groove 23 (FIG. 7C).

Figure 7D:
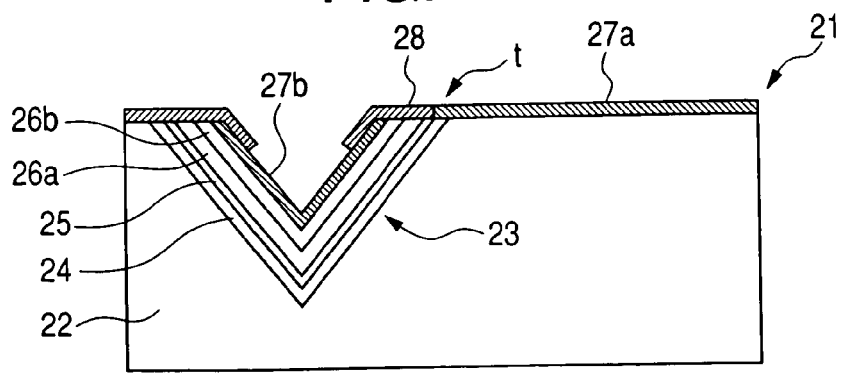

Then, a metal thin film of Ti(50 nm)-Pt(50 nm)-Au(200 nm) is formed on the surface of the diamond substrate 22 by electronic beam evaporation and annealed in Ar at 650° C. for ten minutes. Then, a portion of the formed metal thin film corresponding to an end portion t of the light-emitting layer 25 and the second semiconductor layer 26 is etched in an RIE manner so that metal thin films which serve as the metal electrodes 27a and 27b are formed separately on an end portion t1 of the first semiconductor layer 24 and the contact layer 26b of the second semiconductor layer 26, respectively. Then, an SiO$_2$ layer which serves as the electrically insulating layer 28 is formed by a CVD method so that the formed metal thin films are electrically insulated from each other by the electrically insulating layer 28 (FIG. 7D).

Finally, the diamond substrate 22 is cut and packaged to thereby produce the semiconductor light-emitting device 21 according to the third embodiment.

Then, a voltage is applied between the metal electrodes 27a and 27b of the produced semiconductor light-emitting device 21 to supply a current to the light-emitting layer 25. As a result, emission of ultraviolet light with an emission wavelength of 320 nm becomes intensive in the condition of a light output of 10 mW at 300 mA.

Fourth Embodiment

Figure 8:
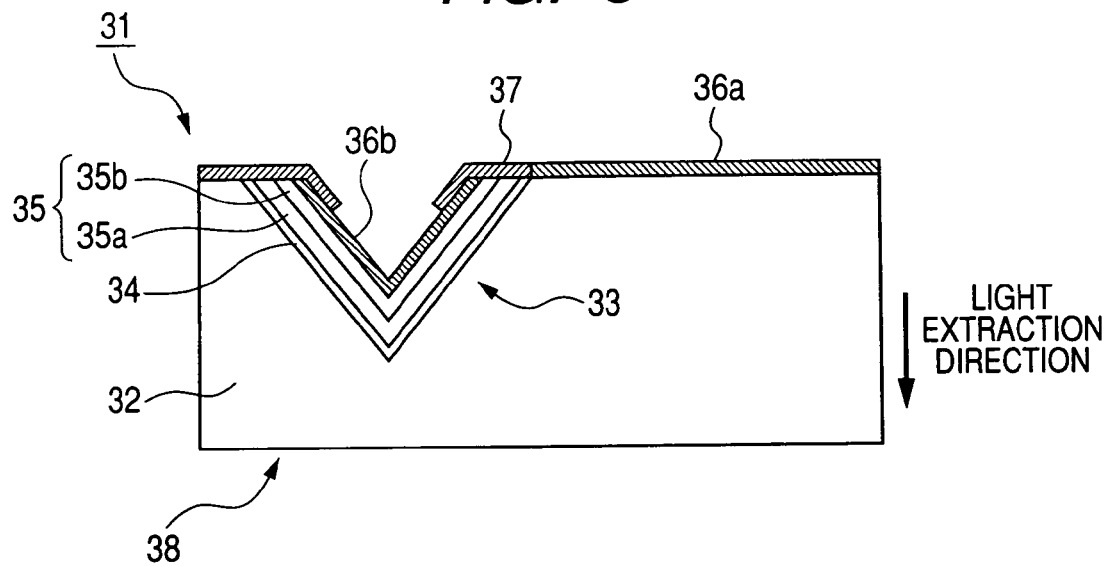
FIG. 8 is an exemplary sectional view showing the schematic configuration of a semiconductor light-emitting device according to a fourth embodiment.
Figure 9:
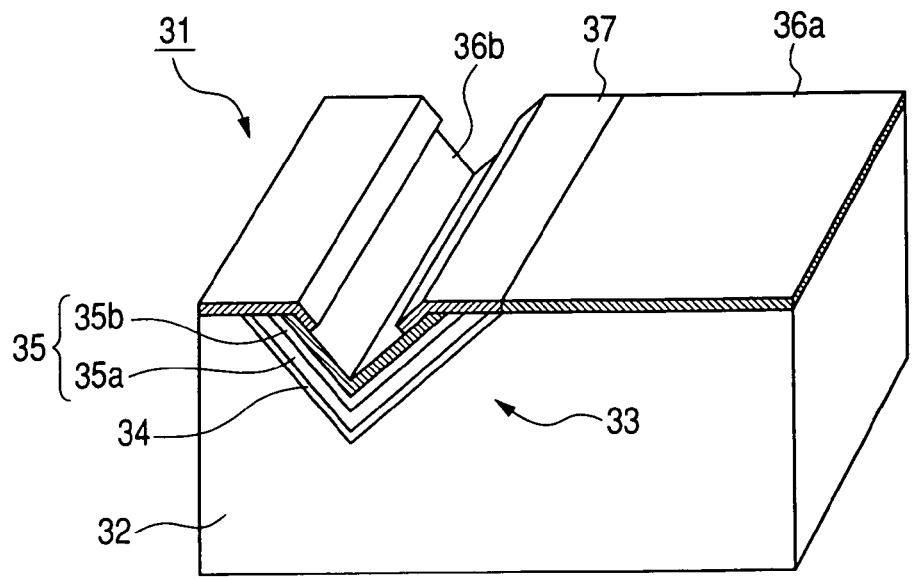
FIG. 9 is an exemplary taper sectional view of the semiconductor light-emitting device according to the fourth embodiment when seen obliquely.

A semiconductor light-emitting device 31 according to a fourth embodiment of the invention will be described with reference to FIGS. 8 and 9. FIG. 8 is a sectional view showing the schematic configuration of the semiconductor light-emitting device 31 according to the fourth embodiment. FIG. 9 is a taper sectional view of the semiconductor light-emitting device 31 according to the fourth embodiment when seen obliquely.

As shown in FIGS. 8 and 9, in the semiconductor light-emitting device 31 according to the fourth embodiment, a V-groove 33 is formed on a p-type or n-type conductive substrate 32. A light-emitting layer 34 lower in refractive index than the substrate 32 is disposed in the V-groove 33. A second semiconductor layer 35 lower in refractive index than the light-emitting layer 34 is disposed on the light-emitting layer 34. The other surface of the substrate 32 opposite to the surface on which the V-groove 33 is formed serves as a light extraction portion 38 through which light emitted from the light-emitting layer 34 is extracted from the semiconductor light-emitting device 31.

Metal electrodes 36a and 36b are electrically connected to the substrate 32 and the second semiconductor layer 35, respectively. An electrically insulating layer 37 is formed so that the metal electrodes 36a and 36b are electrically insulated from each other by the electrically insulating layer 37.

That is, the semiconductor light-emitting device 31 according to the embodiment is characterized in that the first semiconductor layer 24 formed in the V-groove 23 as described in the third embodiment is replaced with the p-type or n-type conductive substrate 32. The remaining configuration is the same as that in the third embodiment so that description thereof will be omitted.

The substrate 32 is made of a material higher in refractive index than the light-emitting layer 34. For example, the substrate 32 may be formed as a p-type or n-type conductive diamond substrate. Incidentally, the substrate 32 used here may be p-type or n-type conductive as a whole or an impurity-diffused layer which has p-type or n-type electric characteristic and which is high in refractive index may be formed as a first semiconductor layer on the surface of the substrate 32.

Next, a method for producing the semiconductor light-emitting device 31 according to the fourth embodiment will be described with reference to FIGS. 10A to 10D.

FIGS. 10A to 10D are sectional views schematically showing the method for producing the semiconductor light-emitting device 31 according to the fourth embodiment.

Figure 10A:
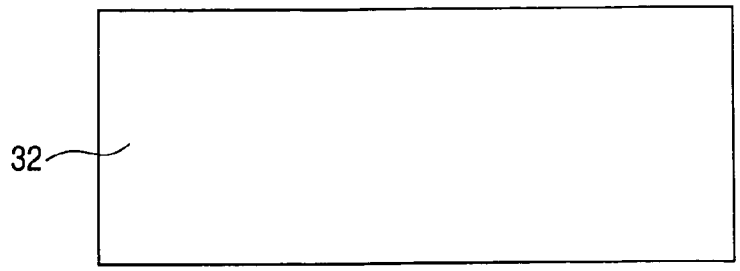
FIGS. 10A to 10D are exemplary sectional views schematically showing a method for producing the semiconductor light-emitting device according to the fourth embodiment.
Figure 10B:
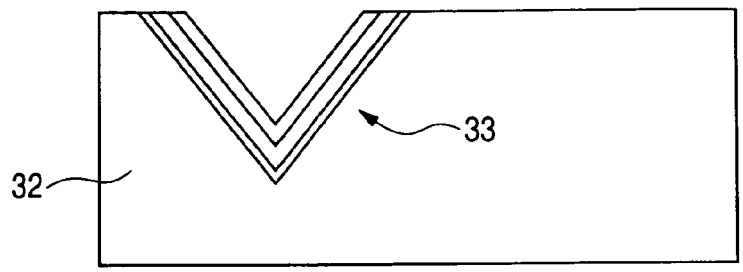

First, a p-type diamond substrate 32 having plane directions of {100} faces and doped with about $1 \times 10^{19}$ cm$^{-3}$ of boron is prepared (FIG. 10A). Then, a V-groove 33 made from plane directions of {111} faces is formed in the surface of the p-type diamond substrate 32 by laser beam machining or the like (FIG. 10B).

Figure 10C:
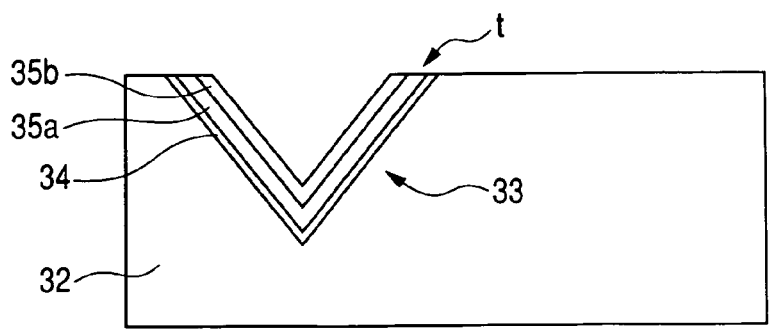

Then, a 100 nm-thick undoped $In_{0.02}Al_{0.44}Ga_{0.54}N$ layer, a 1000 nm-thick n-type $Al_{0.73}Ga_{0.27}N$ layer (Si-doped) and a 1000 nm-thick n-type GaN layer (Si-doped) are laminated continuously as the light-emitting layer 34, the clad layer 35a of the second semiconductor layer 35 and the contact layer 35b of the second semiconductor layer 35, respectively, in the V-groove 33 by an MBE method. Then, part of these layers are removed by etching and patterned so that part of the surface of the diamond substrate 32 is exposed. Thus, the light-emitting layer 34 and the second semiconductor layer 35 are laminated in the V-groove 33 (FIG. 10C).

Figure 10D:
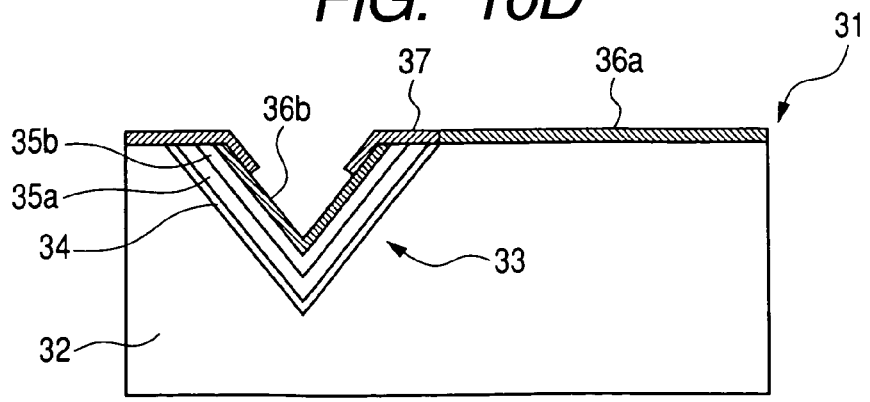

Then, a metal thin film of Ti(50 nm)-Pt(50 nm)-Au(200 nm) is formed on the surface of the diamond substrate 32 by electronic beam evaporation and annealed in Ar at 650° C. for ten minutes. Then, a portion of the formed metal thin film corresponding to an end portion t of the light-emitting layer 34 and the second semiconductor layer 35 is etched in an RIE manner so that metal thin films which serve as the metal electrodes 36a and 36b are formed separately on the diamond substrate 32 and the contact layer 35b of the second semiconductor layer 35, respectively. Then, an $SiO_2$ layer which serves as the electrically insulating layer 37 is formed by a CVD method so that the formed metal thin films are electrically insulated from each other by the electrically insulating layer 37 (FIG. 10D).

Finally, the diamond substrate 32 is cut and packaged to thereby produce the semiconductor light-emitting device 31 according to the fourth embodiment.

Then, a voltage is applied between the metal electrodes 36a and 36b of the produced semiconductor light-emitting device 31 to supply a current to the light-emitting layer 34. As a result, emission of ultraviolet light with an emission wavelength of 320 nm becomes intensive in the condition of a light output of 10 mW at 300 mA.

Fifth Embodiment

Figure 11:
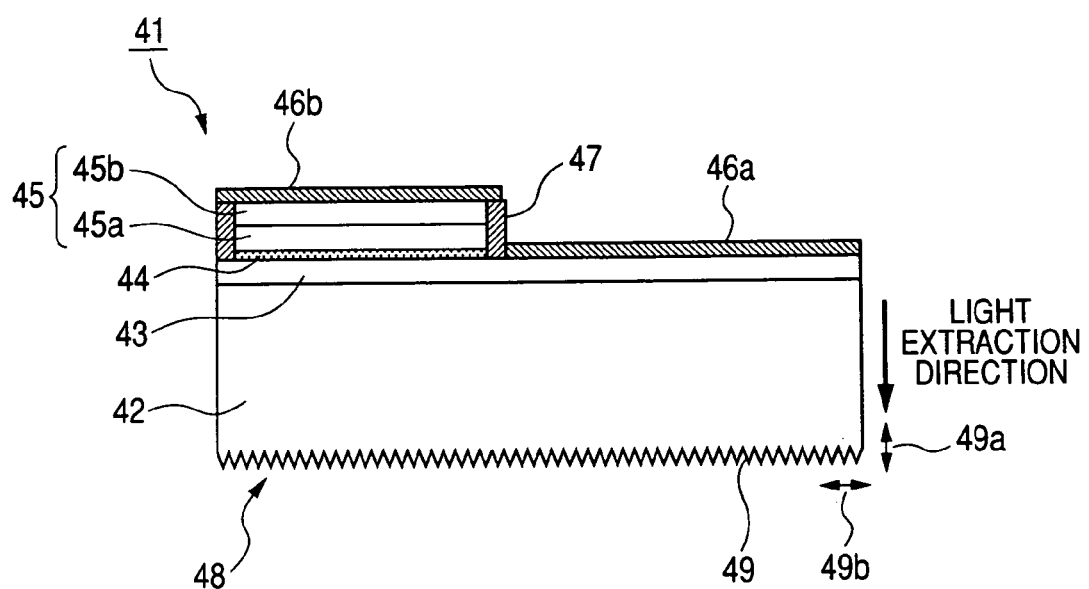
FIG. 11 is an exemplary sectional view showing the schematic configuration of a semiconductor light-emitting device according to a fifth embodiment.

A semiconductor light-emitting device 41 according to a fifth embodiment of the invention will be described with reference to FIG. 11. FIG. 11 is a sectional view showing the schematic configuration of the semiconductor light-emitting device 41 according to the fifth embodiment.

As shown in FIG. 11, in the semiconductor light-emitting device 41 according to the fifth embodiment, a first semiconductor layer 43 is disposed on one surface of a substrate 42. A light-emitting layer 44 lower in refractive index than the first semiconductor layer 43 is disposed on the first semiconductor layer 43. A second semiconductor layer 45 lower in refractive index than the light-emitting layer 44 is disposed on the light-emitting layer 44. The other surface of the substrate 42 opposite to the surface on which the first semiconductor layer 43, the light-emitting layer 44 and the second semiconductor layer 45 are disposed serves as a light extraction portion 48 through which light emitted from the light-emitting layer 44 is extracted from the semiconductor light-emitting device 41.

Further, the light extraction portion 48, that is, the other surface of the substrate 42 opposite to the surface on which the first semiconductor layer 43, the light-emitting layer 44 and the second semiconductor layer 45 are disposed is roughened so as to be formed as irregularities 49. For example, the interval of each irregularity 49 in the depth direction 49a is in a range of from 350 nm to 400 nm. The interval of each irregularity 49 in the width direction 49b is not larger than the wavelength of emitted light. For example, the interval of each irregularity 49 in the width direction 49b is in a range of from 250 nm to 300 nm.

Metal electrodes 46a and 46b are electrically connected to the first semiconductor layer 43 and the second semiconductor layer 45, respectively. An electrically insulating layer 47 is formed so that the metal electrodes 46a and 46b are electrically insulated from each other by the electrically insulating layer 47.

That is, the semiconductor light-emitting device 41 according to the embodiment is characterized in that the surface of the light extraction portion 8 described in the first embodiment is roughened. The remaining configuration is the same as that in the first embodiment so that description thereof will be omitted.

As described above, since the irregularities 49 are formed by roughening the surface of the light extraction portion 48 of the semiconductor light-emitting device 41 according to the fifth embodiment, light with high luminous efficiency can be extracted from the semiconductor light-emitting device 41 with higher extraction efficiency.

Next, a method for producing the semiconductor light-emitting device according to the fifth embodiment will be described with reference to FIGS. 12A to 12E.

FIGS. 12A to 12E are sectional views schematically showing the method for producing the semiconductor light-emitting device 41 according to the fifth embodiment.

Figure 12A:
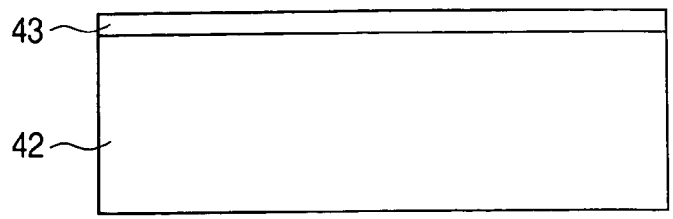
FIGS. 12A to 12E are exemplary sectional views schematically showing a method for producing the semiconductor light-emitting device according to the fifth embodiment.

First, a 1000 nm-thick p-type diamond layer doped with about $1 \times 10^{19}$ cm$^{-3}$ of boron is formed as the first semiconductor layer 43 on one surface of the diamond substrate 42 by a CVD method (FIG. 12A).

Figure 12B:
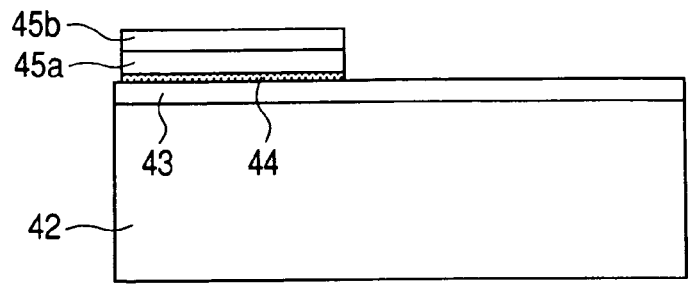

Then, a 100 nm-thick undoped $In_{0.02}Al_{0.44}Ga_{0.54}N$ layer, a 1000 nm-thick n-type $Al_{0.73}Ga_{0.27}N$ layer (Si-doped) and a 1000 nm-thick n-type GaN layer (Si-doped) are laminated continuously as the light-emitting layer 44, the clad layer 45a of the second semiconductor layer 45 and the contact layer 45b of the second semiconductor layer 45, respectively, on the p-type diamond layer. Then, part of these layers are removed by etching and patterned so that part of the surface of the p-type diamond layer is exposed (FIG. 12B).

Figure 12C:
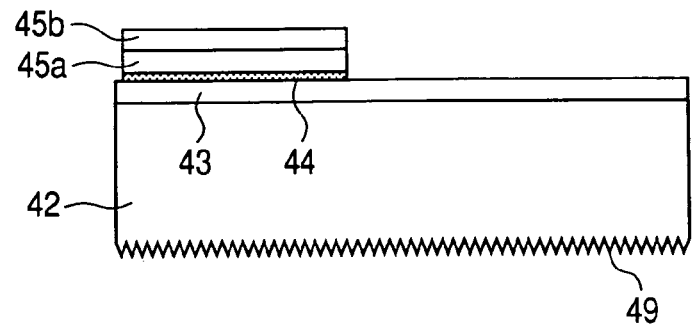

Then, irregularities 49 each with a depth of 380 nm and a width of 280 nm are formed by ECR etching on the other surface of the diamond substrate 42 opposite to the surface on which the first semiconductor layer 43 is formed (FIG. 12C).

Figure 12D:
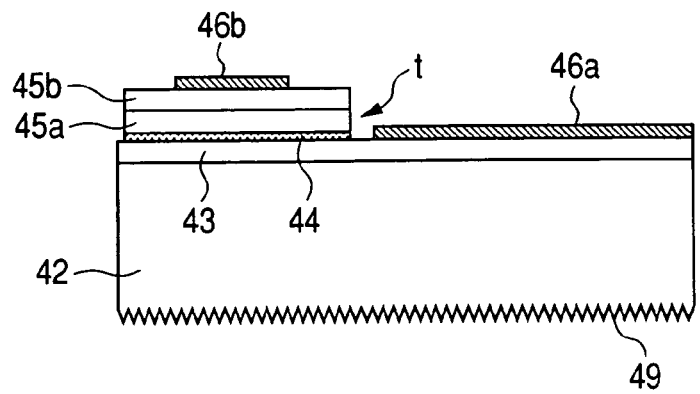

Then, a metal thin film of Ti(50 nm)-Pt(50 nm)-Au(200 nm) is formed on the p-type diamond layer by electronic beam evaporation and annealed in Ar at 650° C. for ten minutes. Then, a portion of the formed metal thin film corresponding to an end portion t of the light-emitting layer 44 and the second semiconductor layer 45 is etched in an RIE manner so that metal thin films which serve as the metal electrodes 46a and 46b are formed separately on the p-type diamond layer and then-type GaN layer (Si-doped), respectively (FIG. 12D).

Figure 12E:
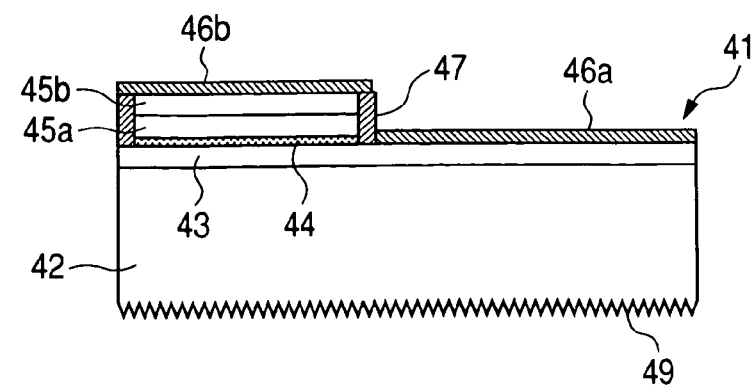

Then, an SiO$_2$ layer which serves as the electrically insulating layer 47 is formed by a CVD method so that the formed metal thin films are electrically insulated from each other by the electrically insulating layer 47 (FIG. 12E).

Finally, the diamond substrate 42 is cut and packaged to thereby produce the semiconductor light-emitting device 41 according to the fifth embodiment.

Then, a voltage is applied between the metal electrodes 46a and 46b of the produced semiconductor light-emitting device 41 to supply a current to the light-emitting layer 44. As a result, emission of ultraviolet light with an emission wavelength of 320 nm is obtained in the condition of a light output of 10 mW at 300 mA.

Sixth Embodiment

Figure 13:
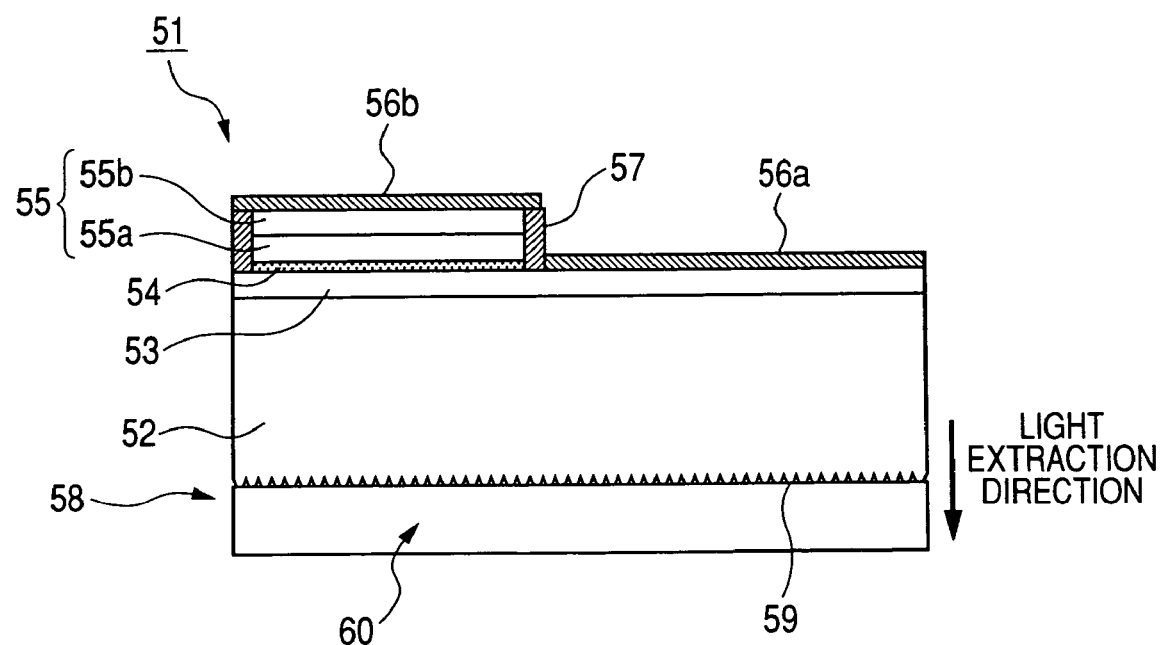
FIG. 13 is an exemplary sectional view showing the schematic configuration of a semiconductor light-emitting device according to a sixth embodiment.

A semiconductor light-emitting device 51 according to a sixth embodiment of the invention will be described with reference to FIG. 13. FIG. 13 is a sectional view showing the schematic configuration of the semiconductor light-emitting device 51 according to the sixth embodiment.

As shown in FIG. 13, in the semiconductor light-emitting device 51 according to the sixth embodiment, a first semiconductor layer 53 is disposed on one surface of a substrate 52. A light-emitting layer 54 lower in refractive index than the first semiconductor layer 53 is disposed on the first semiconductor layer 53. A second semiconductor layer 55 lower in refractive index than the light-emitting layer 54 is disposed on the light-emitting layer 54.

The other surface of the substrate 52 opposite to the surface on which the first semiconductor layer 53, the light-emitting layer 54 and the second semiconductor layer 55 are disposed serves as a light extraction portion 58 through which light emitted from the light-emitting layer 54 is extracted from the semiconductor light-emitting device 51.

Further, the light extraction portion 58, that is, the other surface of the substrate 52 opposite to the surface on which the first semiconductor layer 53, the light-emitting layer 54 and the second semiconductor layer 55 are disposed is roughened so as to be formed as irregularities 59. For example, the interval of each irregularity 59 in the depth direction is in a range of from 350 nm to 400 nm. The interval of each irregularity 59 in the width direction is not larger than the wavelength of emitted light. For example, the interval of each irregularity 59 in the width direction is in a range of from 250 nm to 300 nm.

A fluorescent substance 60 is provided on the irregularities 59. The fluorescent substance 60 will be described later.

Metal electrodes 56a and 56b are electrically connected to the first semiconductor layer 53 and the second semiconductor layer 55, respectively. An electrically insulating layer 57 is formed so that the metal electrodes 56a and 56b are electrically insulated from each other by the electrically insulating layer 57.

That is, the semiconductor light-emitting device 51 according to the embodiment is characterized in that the fluorescent substance 60 is disposed on the irregularities 49 in the surface of the light extraction portion 48 of the substrate 42 described in the fifth embodiment. The remaining configuration is the same as that in the fifth embodiment so that description thereof will be omitted.

The fluorescent substance 60 has characteristic for converting the wavelength of light extracted from the light extraction portion 58 to thereby emit light with various emission colors.

For example, the fluorescent substance 60 is made of YAG generating white light, $Sr_5(PO_4)_3Cl:Eu$ generating blue light, or the like.

As described above, since the fluorescent substance 60 is provided on the irregularities 59 formed by roughening the surface of the light extraction portion 58, the semiconductor light-emitting device 51 according to the sixth embodiment can emit light with high luminous efficiency and high extraction efficiency as multi-color light with various emission colors.

Although embodiments have been described above, the invention is not limited to the embodiments and can be modified and carried out within the technical idea of the invention. For example, in the semiconductor light-emitting device 11 according to the second embodiment of the invention, irregularities described in the fifth embodiment may be formed by roughening the other surface of the substrate 12 opposite to the surface where the light-emitting layer 13 is disposed, and the fluorescent substance described in the sixth embodiment may be further provided on the roughened surface of the irregularities. In the semiconductor light-emitting device 21 or 31 according to the third or fourth embodiment of the invention, irregularities described in the fifth embodiment may be formed by roughening the other surface of the substrate 22 or 32 opposite to the surface where the V-groove 23 or 33 is disposed, and the fluorescent substance described in the sixth embodiment may be further provided on the roughened surface of the irregularities.

The light-emitting device according to the invention is chiefly applicable to a display device, an illuminator or a recording device generally widely used. Moreover, the light-emitting device according to the invention can be substituted for a bulb, a fluorescent lamp or the like.

According to the above-embodiments, it is possible to provide a semiconductor light-emitting device with high luminous efficiency, low heat generation and long life.

What is claimed is:

1. A semiconductor light-emitting device, comprising:
   a first semiconductor layer;
   a light-emitting layer being disposed on the first semiconductor layer, and the light-emitting layer being lower in refractive index than the first semiconductor layer;
   a second semiconductor layer being disposed on the light-emitting layer, and the second semiconductor layer being lower in refractive index than the light-emitting layer;
   metal electrodes connected to the first semiconductor layer and the second semiconductor layer respectively, and the metal electrodes supplying a current to the light-emitting layer;
   a light extraction portion for extracting light emitted from the light-emitting layer; and
   a fluorescent substance converting a wavelength of the emitted light on the light extraction portion, the fluorescent substance disposed on the light extraction portion, wherein the light-emitting layer and the second semiconductor layer are nitride semiconductors different in aluminum concentration.

2. A semiconductor light-emitting device according to claim 1, further comprising:
   a light extraction portion having a surface roughness and extracting light emitted from the light-emitting layer.

3. A semiconductor light-emitting device according to claim 1, wherein light emitted from the light-emitting layer is extracted from a first semiconductor layer side.

4. A semiconductor light-emitting device according to claim 3, further comprising:

a light extraction portion having a surface roughness and extracting light emitted from the light-emitting layer.

5. A semiconductor light-emitting device according to claim 4, further comprising:
a fluorescent substance converting a wavelength of the emitted light on the light extraction portion, the fluorescent substance disposed on the light extraction portion.

6. A semiconductor light-emitting device according to claim 1, wherein the first semiconductor layer is an electrically conductive diamond thin film which is formed on a diamond substrate.

7. A semiconductor light-emitting device according to claim 6, further comprising:
a light extraction portion having a surface roughness and extracting light emitted from the light-emitting layer.

8. A semiconductor light-emitting device according to claim 7, further comprising:
a fluorescent substance converting a wavelength of the emitted light on the light extraction portion, the fluorescent substance disposed on the light extraction portion.

9. A semiconductor light-emitting device according to claim 1, wherein the first semiconductor layer is an electrically conductive diamond substrate which is formed on a diamond substrate.

10. A semiconductor light-emitting device according to claim 9, further comprising:
a light extraction portion having a surface roughness and extracting light emitted from the light-emitting layer.

11. A semiconductor light-emitting device according to claim 10, further comprising:
a fluorescent substance converting a wavelength of the emitted light on the light extraction portion, the fluorescent substance disposed on the light extraction portion.

12. A semiconductor light-emitting device according to claim 1, wherein the first semiconductor layer is an electrically conductive diamond thin film disposed in a substantially V-groove that is formed on the diamond substrate.

13. A semiconductor light-emitting device according to claim 12, further comprising:
a light extraction portion having a surface roughness and extracting light emitted from the light-emitting layer.

14. A semiconductor light-emitting device according to claim 9, wherein the light-emitting layer and the second semiconductor layer are disposed in a V-groove formed on the electrically conductive diamond substrate.

15. A method of producing a semiconductor light-emitting device, comprising:
forming a first semiconductor layer on a substrate;
forming a light-emitting layer lower in refractive index than the first semiconductor layer, on the first semiconductor layer;
forming a second semiconductor layer lower in refractive index than the light-emitting layer, on the light-emitting layer;
forming metal electrodes to be connected to the first semiconductor layer and the second semiconductor layer, the metal electrodes supplying a current to the light-emitting layer;
forming a light extraction portion for extracting light emitted from the light-emitting layer; and
forming a fluorescent substance converting a wavelength of the emitted light on the light extraction portion, the fluorescent substance disposed on the light extraction portion, wherein the first semiconductor layer, the light-emitting layer and the second semiconductor layer are formed in a V-groove formed on the substrate.

16. A method of producing a semiconductor light-emitting devices comprising:
forming a light-emitting layer lower in refractive index than an electrically conductive substrate, on a substrate;
forming a second semiconductor layer lower in refractive index than the light-emitting layer, on the light-emitting layer;
forming metal electrodes to be connected to the substrate and the second semiconductor layer respectively, and the metal electrodes supplying a current to the light-emitting layer;
forming a light extraction portion for extracting light emitted from the light-emitting layer; and
forming a fluorescent substance converting a wavelength of the emitted light on the light extraction portion, the fluorescent substance disposed on the light extraction portion, wherein the light-emitting layer and the second semiconductor layer are formed in a V-groove formed on the substrate.

* * * * *